United States Patent [19]
Long et al.

[11] Patent Number: 6,093,787
[45] Date of Patent: Jul. 25, 2000

[54] LIQUID CRYSTALLINE POLYESTERS AND MOLDING COMPOSITIONS PREPARED THEREFROM

[75] Inventors: Timothy Edward Long, Blountville; Peggy Spears Birch; James Rodney Bradley, both of Kingsport, all of Tenn.

[73] Assignee: Eastman Chemical Company, Kingsport, Tenn.

[21] Appl. No.: 09/058,015

[22] Filed: Apr. 9, 1998

Related U.S. Application Data

[60] Provisional application No. 60/048,773, Jun. 6, 1997.

[51] Int. Cl.$^7$ ..................................................... C08G 64/00
[52] U.S. Cl. ........................ 528/272; 528/298; 528/302; 528/307; 528/308; 524/494; 428/1
[58] Field of Search ..................................... 528/272, 298, 528/302, 307, 308, 308.6, 361, 176, 190, 194, 206; 524/494; 428/1

[56] References Cited

U.S. PATENT DOCUMENTS 4,169,933 10/1979 Jackson, Jr. et al. .
4,327,206 4/1982 Jackson, Jr. et al. .

FOREIGN PATENT DOCUMENTS 0 022 752A 1/1981 European Pat. Off. .
0 286 444 10/1988 European Pat. Off. .

OTHER PUBLICATIONS

Patent Abstracts of Japan, vol. 18, No. 591 (C–1272) Nov. 11, 1994 & JP 06 220178A (Nippon Oil Co. Ltd.) Aug. 9, 1994.

Derwent Publications Ltd., London, GB; JP 01 167 362 A, Tosoh Corporation, Jul. 3, 1983.

Chemical Abstracts, vol. 96, No. 18, May 1982, #143444r, Polk M. et al: "Liquid Crystal Block Copolyesters II", p. 9.

*Primary Examiner*—Terressa M. Boykin
*Attorney, Agent, or Firm*—Betty J. Boshears; Harry J. Gwinnell

[57] ABSTRACT

Disclosed is a select class of liquid crystalline polyesters and molding compositions comprising the polyesters and glass fiber. The liquid crystalline polyesters consist essentially of (1) diacid residues consisting essentially of (i) cyclohexanedicarboxylic acid residues and (ii) other diacid residues selected from terephthalic acid residues, 2,6-naphthalenedicarboxylic acid residues, or a mixture thereof; (2) diol residues consisting essentially of hydroquinone residues, 4,4'-biphenol residues or a mixture thereof; and, optionally, (3) p-hydroxybenzoic acid residues. In the above definition, the moles of diol residues are equal to the moles of diacid residues and the total of the (1), (2) and (3) mole percentages is equal to 100. The liquid crystalline polyesters have melting points determined by differential scanning calorimetry equal to or less than 375° C.

18 Claims, No Drawings

LIQUID CRYSTALLINE POLYESTERS AND MOLDING COMPOSITIONS PREPARED THEREFROM

REFERENCE TO RELATED APPLICATION

This application claims the benefit of U.S. Provisional Application Ser. No. 60/048,773, filed Jun. 06, 1997.

FIELD OF THE INVENTION

This invention pertains to a select class of liquid crystalline polyesters which exhibit a combination of good tensile, Izod impact and flexural properties coupled with the excellent moldability (shear-thinning behavior) required when extruding or injection molding intricately designed articles or parts. More specifically, this invention pertains to a group of liquid crystalline polyesters which contain cyclohexanedicarboxylic acid moieties and to molding compositions comprising one or more of the liquid crystalline polyesters and glass fiber.

BACKGROUND OF THE INVENTION

Liquid crystalline polyesters (LCP's) are unique polymers because they possess good to excellent tensile, flexural, and temperature resistance (thermal stability) properties which are very desirable for high performance applications such as in structural and electronic applications. U.S. Pat. No. 4,169,933 discloses a group of liquid crystalline polyesters which consist essentially of residues of terephthalic acid, 2,6-naphthalenedicarboxylic acid, hydroquinone, and p-hydroxybenzoic acid. Although these known LCP's possess very good color, tensile, flexural, and thermal resistance properties, they are relatively expensive due, primarily, to the cost of the 2,6-naphthalenedicarboxylic acid and p-hydroxybenzoic acid monomers (or functional equivalents thereof) used in their preparation.

It, therefore, would be desirable to replace some of the monomers used in the manufacture of liquid crystalline polyesters with less expensive monomers, such as aliphatic or cycloaliphatic dicarboxylic acids, while maintaining the desirable properties of the LCP, e.g., good to excellent color, tensile, flexural, and thermal resistance properties. Those skilled in the art are aware that the use of such monomers as aliphatic or cycloaliphatic dicarboxylic acids in the manufacture of LCP's may result in an LCP which exhibits inferior properties, particularly inferior temperature resistance, flexural modulus, and overall level of liquid crystallinity, as compared to analogous, all-aromatic LCP's. Also, it is well known that highly liquid crystalline polymers exhibit shear-thinning behavior during injection molding, extrusion, and other processes in which the polymer is subjected to relatively high levels of shear, and any appreciable decrease in this shear-thinning behavior is undesirable. This characteristic is of particular importance during the injection of an LCP into very intricate molds in the injection molding of circuit boards having very thin sections that are widely used in the present age of computers and miniaturization. Further, it is well known that the use of more monomers in the preparation of a polymer usually reduces the melting point (<400° C. preferred), but the level of spherulitic crystallinity of the polymeric product also is very often reduced to an undesirably low level. A low level of spherulitic crystallinity may affect deleteriously the temperature resistance properties of the polymer.

It is an object of this invention to provide novel liquid crystalline polyester compositions. Another object of the invention is to provide liquid crystalline polyesters consisting essentially of certain levels of residues of terephthalic acid, cyclohexanedicarboxylic acid, 2,6-naphthalenedicarboxylic acid, hydroquinone, 4,4'-biphenol and/or p-hydroxybenzoic acid that exhibit a combination of good mechanical and thermal resistance properties, and can be produced at a cost lower than that of the analogous all-aromatic LCP.

SUMMARY OF THE INVENTION

The compositions of the invention are liquid crystalline polyesters consisting essentially of:

(1) diacid residues consisting of (i) 2 to 34 mole percent cyclohexanedicarboxylic acid (CHDA) residues and (ii) 5 to 48 mole percent of other diacid residues selected from terephthalic acid (T) residues, 2,6-naphthalenedicarboxylic acid (N) residues, or a mixture thereof;

(2) diol residues consisting essentially of 15 to 50 mole percent of hydroquinone (HQ) residues, 4,4'-biphenol residues or a mixture thereof; and (3) 0 to 70 mole percent p-hydroxybenzoic acid (PHB) residues, wherein the moles of diol residues are equal to the moles of diacid residues and the total of the (1), (2) and (3) mole percents is equal to 100. The mole percentages specified in the above definitions of (1), (2) and (3) are based on the total residues which make up the LCP's. These LCP's are further characterized by having melting points determined by differential scanning calorimetry (DSC) equal to or less than 375° C. The liquid crystalline polyesters exhibit a combination of good tensile and flexural properties and color coupled with excellent moldability (shear-thinning behavior). While it is preferred that the LCP's of the invention contain only the residues specified above, it is permissible for the LCP's to contain minor amounts, e.g., up to a total of 10 mole percent, of residues of other aromatic dicarboxylic acids such as isophthalic acid and/or other dihydroxy compounds such as naphthalene diols and resorcinol.

The liquid crystalline polyesters provided by the present invention are useful for a variety of end uses which require a combination of good tensile and flexural properties coupled with excellent moldability (shear-thinning behavior). The LCP's also are useful in extruded or blown film applications requiring exceptional barrier properties and/or chemical resistance and as an overlay for corrosive applications. When filled with glass fibers or other fillers, the LCP's find utility in electronic applications and structural applications, e.g., for use in extruding or injection molding intricately-designed and/or thin parts such as electrical connectors.

Those skilled in the art would expect that the presence of non-aromatic residues such as residues of 1,4-cyclohexanedicarboxylic acid (cis/trans isomers) could cause substantial degradation of one or more of the excellent properties described above, especially color. This expectation would be particularly true for temperature resistance, flexural modulus, and overall level of liquid crystallinity exhibited by the polymeric product. This expectation would be true especially when the cis isomer of 1,4-cyclohexanedicarboxylic acid is utilized because of its axial-equatorial stereoisomeric structure. Thus, the discovery that all-aromatic LCP's comprising residues of terephthalic acid, 2,6-naphthalenedicarboxylic acid, hydroquinone, 4,4'-biphenol and/or p-hydroxybenzoic could be modified with cis/trans-1,4-cyclohexanedicarboxylic acid without sacrificing the aforesaid properties was unexpected. It is well-known that highly liquid crystalline polymers exhibit shear-thinning behavior during injection molding, extrusion, and other processes in which the polymer is subjected to relatively high levels of shear, and any appreciable decrease in this shear-thinning behavior is undesirable, particularly during injection molding in intricately designed molds.

We have found that glass fiber-reinforced LCP's derived from terephthalic acid, 2,6-naphthalenedicarboxylic acid, hydroquinone, 4,4'-biphenol and/or p-hydroxybenzoic and modified with cis/trans-1,4-cyclohexanedicarboxylic acid have excellent spiral flow, equal to that of a control containing no cis/trans-1,4-cyclohexanedicarboxylic acid modification. It is well known that the use of more monomers in the preparation of a polymer usually reduces the level of spherulitic crystallinity of the polymeric product that will deleteriously affect the temperature resistance properties of the polymer. We also have demonstrated that the LCP's of the invention which contain cis/trans-1,4-cyclohexanedicarboxylic acid residues exhibit excellent thermal stability during injection molding (<0.05 IV units lost during molding), indicating that the presence of the cyclohexanedicarboxylic acid residues does not affect significantly the thermal stability of the LCP's at their processing temperatures.

Another potential problem posed by the inclusion of 1,4-cyclohexanedicarboxylic acid residues in the LCP's of the invention was the stability and reactivity of 1,4-cyclohexanedicarboxylic acid. For example, it was not readily apparent that the cycloaliphatic monomer (1,4-cyclohexanedicarboxylic acid) could withstand the high temperature/highly acidic environment of the processes utilized in the preparation of the LCP's. The lack of adequate thermal/acid stability could have resulted in the LCP being discolored. However, the LCP's of the present invention have essentially the same color as that of the analogous all-aromatic LCP's. A difference in the reactivities of cycloaliphatic and aromatic dicarboxylic acids could have resulted in undesirable blocking and formation of high-melting micro domains or "unmelts" in the LCP's. Furthermore, the presence of 1,4-cyclohexanedicarboxylic acid residues also could lead to undesirably low melting points and/or low levels of crystallinity.

DESCRIPTION OF THE INVENTION

Our novel liquid crystalline polyesters consist essentially of (1) diacid residues consisting essentially of (i) cyclohexanedicarboxylic acid residues and (ii) other diacid residues selected from terephthalic acid residues, 2,6-naphthalenedicarboxylic acid residues, or a mixture thereof; (2) diol residues consisting essentially of hydroquinone residues, 4,4'-biphenol residues or a mixture thereof; and, optionally, (3) p-hydroxybenzoic acid residues. These LCP's may be prepared by procedures well-known to those skilled in the art, e.g., by heating the dicarboxylic acids and the acyl (ester) derivatives of hydroquinone and/or 4,4'biphenol and, optionally, p-hydroxybenzoic acid with or without a catalyst to form the LCP and a volatile carboxylic acid. The HQ, BP and PHB residues of the present liquid crystalline polyesters preferably are provided by their acetate esters, i.e., p-phenylene diacetate, 4,4'-biphenylene diacetate and p-acetoxybenzoic acid. Alternatively, the compositions may be prepared by heating the dicarboxylic acids, hydroquinone, biphenol and p-hydroxybenzoic acid in a reactor with an aliphatic acid anhydride (such as acetic or propionic anhydride) in the presence or absence of a catalyst, to first carry out the acylation of the hydroxy groups and then effect the polycondensation reaction as before described. This procedure may be modified, for example, by performing the acylation/esterification in a first reactor, transferring the esterification product to a second reactor, adding the dicarboxylic acids, and carrying out the polycondensation reaction as before described.

The LCP monomers also may be polymerized to a relatively low molecular weight by one of the previously described methods to form a prepolymer which can be further polymerized to high molecular weight by solid-state polymerization techniques well known to those skilled in the art. In another variation, a prepolymer of the LCP's may be prepared with or without a catalyst in an extruder and further polymerized to high molecular weight by solid-state polymerization techniques well known to those skilled in the art.

The dicarboxylic acid residues of the LCP's may be derived from the diacids themselves or from derivatives thereof such as di-aryl esters, e.g., diphenyl terephthalate and diphenyl 2,6-naphthalenedicarboxylate. If the diphenyl esters are utilized, the hydroxyl groups of the hydroquinone, biphenol and p-hydroxybenzoic acid monomer reactants preferably are not esterified. The cyclohexanedicarboxylic acid residues may be derived from cis- or trans-cyclohexanedicarboxylic acid or, more typically, from a mixture of the cis- and trans-isomers. The cyclohexanedicarboxylic acid used to prepare the LCP's of this invention preferably is a mixture of cis- and trans-isomers having a cis:trans mole ratio in the range of 40:60 to 90:10. The cyclohexanedicarboxylic acid used may be either 1,3- or, preferably, 1,4-cyclohexanedicarboxylic acid. Cyclohexanedicarboxylic acid residues preferably constitute about 5 to 50 mole percent of the total diacid residue component of the LCP's.

Examples of catalysts which may be used in the preparation of the liquid crystalline polyesters include dialkyl tin oxide, diaryl tin oxide, titanium dioxide, alkoxy titanium silicates, titanium alkoxides, alkali metal and alkaline earth metal salts of carboxylic acids, gaseous acid catalysts such as Lewis acids (e.g., $BF_3$), hydrogen halides (e. g., HCL), and the like. The quantity of catalyst utilized is typically about 50 to about 500 parts per million, based on the total weight of starting materials (less the acyl anhydride, if any, used as described below). If a multi-step reaction process is used as below described, the catalyst may be added to the acylation or polycondensation steps. Normally, the use of about 100 to about 300 parts per million by weight of at least one alkali metal-containing catalyst is sufficient.

The liquid crystalline polyesters of the invention may contain various additives and fillers such as antioxidants, glass fibers, titanium dioxide, carbon black, flame retardants, and drip suppressants. These additives may be compounded with the LCP's of the invention by methods well known to those skilled in the art, e.g., by extrusion of a physical mixture of the materials in an extruder. Certain of the additives, e.g., antioxidants and carbon black, may be added to the reactor before or during the preparation of the LCP's.

The liquid crystalline polyesters of the present invention have inherent viscosities (I.V.'s) in the range of about 3.5 to 10 dL/g, preferably about 4 to 8 dL/g, measured at 25° C. in 60:40 by weight pentafluorophenol/1,2,4-trichlorobenzene at 0.1 g/100 mL in a Schott Gerate viscometer. The LCP's of the present invention have melting points determined by differential scanning calorimetry (DSC) equal to or less than 375° C. Thus, while it may be possible to create LCP's consisting of residues within the scope of the above definitions of residues (1), (2) and (3) but having melting points above 375° C., such LCP's can be prepared and/or processed, if at all, only with great difficulty and, therefore, are not within the scope of the present invention. While the presence of PHB residues is characterized hereinabove as "optional", certain of the LCP's of the present invention require the presence of PHB residues in order that the LCP's have melting points equal to or less than 375° C. For example, liquid crystalline polyesters in which the diol residues component consists of, or consists essentially of, BP residues, must contain at least about 15 mole percent PHB residues in order that it have a melting point equal to or less than 375° C.

It is preferred that the LCP's of the present invention contain diol residues consisting essentially of either hydroquinone or 4,4'-biphenol residues.

Therefore, a first preferred group of the LCP's consist essentially of:
(1) diacid residues consisting of (i) 2 to 34 mole percent cyclohexanedicarboxylic acid (CHDA) residues and (ii) 5 to 48 mole percent of other diacid residues selected from terephthalic acid (T) residues, 2,6-naphthalenedicarboxylic acid (N) residues, or a mixture thereof;
(2) diol residues consisting essentially of 16.5 to 50 mole percent of hydroquinone (HQ) residues; and
(3) 0 to 67 mole percent p-hydroxybenzoic acid (PHB) residues,
wherein the moles of diol residues are equal to the moles of diacid residues, the total of the (1), (2) and (3) mole percentages is equal to 100, and the LCP's have melting points determined by differential scanning calorimetry (DSC) in the range of about 260 to 375° C.

A second preferred group of the LCP's consist essentially of:
(1) diacid residues consisting of (i) 2 to 30 mole percent cyclohexanedicarboxylic acid (CHDA) residues and (ii) 5 to 40.5 mole percent of other diacid residues selected from terephthalic acid (T) residues, 2,6-naphthalenedicarboxylic acid (N) residues, or a mixture thereof;
(2) diol residues consisting essentially of 15 to 42.5 mole percent of 4,4'-biphenol (BP) residues; and
(3) 15 to 70 mole percent p-hydroxybenzoic acid (PHB) residues,
wherein the moles of diol residues are equal to the moles of diacid residues, the total of the (1), (2) and (3) mole percentages is equal to 100, and the LCP's have melting points determined by differential scanning calorimetry (DSC) equal to or less than 375° C.

Molding compositions comprising an intimate blend of the above-described liquid crystalline polyesters and glass fibers constitute a second embodiment of the present invention. Normally, the polyester compositions will contain at least 20 weight percent, preferably about 25 to 40 weight percent, based on the total weight of the molding composition, glass fibers. The glass fibers useful in preparing the compositions of the invention include those having thicknesses (diameters) of about 9 to 15 microns and fiber lengths of about 0.8 to 26 mm (about 1/32 to 1 inch). The glass fibers may be coated or uncoated.

The LCP/glass fiber compositions of the present invention are especially useful for molding relatively thin articles, e.g., a thickness of less than 1.5 mm, preferably less than 1 mm. The LCP/glass fiber compositions and molded articles may be prepared using techniques and procedures which are conventional in the compounding and shaping of synthetic polymer compositions. For example, one or more of the liquid crystalline polyesters defined herein may be compounded with glass fiber in an extruder and converted to glass-filled LCP pellets. The liquid crystalline polyester and glass fiber may be compounded in 10 to 400-mm, twin-screw extruders which may be co-rotating or counter-rotating. Pellets of the LCP/glass fiber compositions may be formed into molded articles by means of an injection molding machine. Suitable injection molding machines typically have 20 to about 500 tons clamping force.

The preparation of the liquid crystalline polyesters and the glass fiber-containing compositions of the present invention is further illustrated by the following examples. The 1,4-cyclohexanedicarboxylic acid used in the examples consisted of an 80:20 cis:trans isomeric mixture unless specified otherwise.

In the examples, inherent viscosities of the LCP's are measured at 25° C. in 60:40 by weight pentafluorophenol/1,2,4-trichlorobenzene mixture using a polymer concentration of 0.1 g/100 mL in a Schott Gerate viscometer. The samples are dissolved by stirring at room temperature. Melting points are determined using a Differential Scanning Calorimeter, Model 2920, using a Thermal Analyst 2200 control system with LNCA II accessory at a heating rate of 20° C. per minute.

The composition of the liquid crystalline polyesters is determined by hydrolyzing about 100 mg of the polyester in a magnetically-stirred culture tube in 2 mL of deoxygenated dimethyl sulfoxide (d6) and 0.5 ml of deoxygenated 5 N NaOH in methanol (d4). The hydrolysis is carried out at 80° C. After the hydrolysis, the tube is cooled slightly and then 5 mL of deoxygenated $D_2O$ containing a reference is added to dissolve all the solids. The solution then is added to a NMR tube and capped. The proton NMR spectral data are collected with a JEOL Delta 270 Spectrometer operating at 270.05 MHz for observation of the proton nucleus.

CONTROL EXAMPLE 1

This example illustrates the preparation of an all-aromatic, control LCP containing no 1,4-cyclohexanedicarboxylic acid (CHDA) residues.

A 500-mL, single-necked flask is equipped with a stainless steel stirrer and provisions for applying vacuum, maintaining a nitrogen atmosphere, and removal of volatile materials. Into the flask are placed 8.50 g of terephthalic acid, 27.20 g of 2,6-naphthalenedicarboxylic acid, 36.3 g of p-phenylene diacetate, and 45.9 g of p-acetoxybenzoic acid. The flask then is evacuated, bled to nitrogen three times and then is partially immersed in a Belmont metal bath maintained at 280° C. for 1 hour. During this time, the contents of the flask become fluid and stirring is started. The flask is then heated with stirring under a nitrogen atmosphere at 300° C. for 1 hour, 320° C. for 1 hour, and 350° C. for 15 minutes. Vacuum then is applied during 15 minutes to a pressure of 0.5 torr for 80 minutes to obtain a high viscosity, tan polymer. The system is then bled to nitrogen, the flask is cooled to room temperature under a nitrogen atmosphere, and the polymer is removed from the flask. The polymer has an IV of 7.8 and a melting point of 325° C.

EXAMPLE 1

This example illustrates the preparation of an LCP containing 8.6 mole percent 1,4-cyclohexanedicarboxylic acid residues but no terephthalic acid residues. The procedure described in Control Example 1 is repeated using the following charge of materials: 7.40 g of cis/trans-1,4-cyclohexanedicarboxylic acid, 21.60 g of 2,6- naphthalenedicarboxylic acid, 30.50 g of p-phenylene diacetate, and 38.60 g of p-acetoxybenzoic acid. A very high viscosity, tan polymer having an IV of 6.0 and a melting point of 300° C. is obtained.

EXAMPLE 2

This example illustrates the preparation of an LCP consisting of residues of 1,4-cyclohexanedicarboxylic acid, terephthalic acid, 2,6-naphthalenedicarboxylic acid, hydroquinone and p-hydroxybenzoic acid in which the level of 1,4-cyclohexanedicarboxylic acid residues is 8.1 mole percent and the level of p-hydroxybenzoic acid residues has been decreased to 10.6 mole percent. The procedure of Control Example 1 is repeated using the flowing charge of materials: 5.10 g of terephthalic acid, 14.80 g of cis/trans-1,4-cyclohexanedicarboxylic acid, 16.60 g of 2,6-naphthalenedicarboxylic acid, 41.30 g of p-phenylene diacetate, and 20.00 g of p-acetoxybenzoic acid. A very high viscosity, tan polymer having an IV of 7.1 and a melting point of 282° C. is obtained.

EXAMPLE 3

This example illustrates the preparation of an LCP composition similar to that of Example 2 except with a lower level of terephthalic acid and a similar level of 2,6-naphthalenedicarboxylic acid. The procedure of Example 2 is repeated except that the following materials are charged to the reaction flask: 10.20 g of terephthalic acid, 14.80 g of cis/trans-1,4-cyclohexanedicarboxylic acid, 9.90 g of 2,6-naphthalenedicarboxylic acid, 41.00 g of p-phenylene diacetate, and 20.40 g of p-acetoxybenzoic acid. A very high viscosity, tan polymer having an IV of 8.7 and a melting point of 310° C. is obtained.

EXAMPLE 4

This example illustrates the preparation of an LCP composition containing a relatively high level of 1,4-cyclohexanedicarboxylic acid residues and no p-acetoxybenzoic acid residues. The procedure of Example 2 is repeated except the materials charged are as follows: 4.20 g of terephthalic acid, 19.40 g of cis/trans-1,4-cyclohexanedicarboxylic acid, 24.30 g of 2,6-naphthalenedicarboxylic acid, and 48.50 g of p-phenylene diacetate. A very high viscosity, tan polymer having an IV of 6.0 and a melting point of 335° C. is obtained.

EXAMPLE 5

The materials listed below are placed into a jacketed, stainless steel reactor equipped with dual sigma-blade agitator, a reflux condenser, coolant water, pressurization capability, vacuum capability, a source of nitrogen gas, and an outlet through which the by-products of the polymerization are removed:

1,4-Cyclohexanedicarboxylic acid, 65 mole percent cis isomer (4.11 lbs.; 10.84 moles)

Terephthalic acid (3.40 lbs.; 9.29 moles), 2,6-Naphthalenedicarboxylic acid (5.16 lbs.; 10.84 moles), Hydroquinone diacetate (13.90 lbs.; 32.50 moles) and p-Acetoxybenzoic acid (18.43 lbs.; 46.44 moles).

The reactor is pressurized to 3.1 bars absolute (30 pounds per square inch gauge—psig) with nitrogen three times and depressurized to remove the air. The reactor then is pressurized to 2.7 bars absolute (25 psig) with nitrogen and heated to 280° C. where it is stirred for 3 hours. The reactor is then depressurized at the rate of 0.2 bar (3 psi) per minute to 1 bar absolute ( ) psig) and a nitrogen sweep is begun at 5 standard cubic feet per hour for the remainder of the synthesis. The polymer temperature is increased to 320° C. for 30 minutes, 330° C. for 30 minutes and 340° C. for 5 minutes. The nitrogen flow is stopped, vacuum is applied at the rate of 13 mm per minute to 0.5 torr, and the polymerization is continued for 35 minutes. The reactor is then bled to nitrogen and the product is removed from the reactor. The light tan, opaque polymer has an I.V. of 5.46 and consisted of 10 mole percent CHDA residues, 8.6 mole percent T residues, 10 mole percent N residues, 28.6 mole percent HQ residues and 42.8 mole percent PHB residues.

The liquid crystalline polyester is ground for injection molding and the granulated polymer is dried overnight in a dehumidified air dryer at 150° C. and then is injection molded in a BOY 50-S Injection Molding Machine at 90° C.-mold at 320° C. and 35.5 bars absolute (500 psig) into standard bars for tensile and flexural testing. The liquid crystalline polyester has the following properties:

| IZOD Impact Strength, foot-pounds/inch (ASTM D256) | |
|---|---|
| Notched at 23° C. | 22 (partial breaks) |
| Unnotched at 23° C. | 22 (partial breaks) |
| Tensile Properties (ASTM D638) | |
| Break, psi. | 12,171 |
| Break, Elongation, % | 2.9 |
| Flexural Properties (ASTM D790) | |
| Break, psi. | 13,761 |
| Elongation at break, % | 4.8 |
| Modulus, k-psi. | 699 |
| Heat Distortion Properties (ASTM D648) | |
| At 264 psi., ° C. | 225 |
| I. V. Data, dL/g | |
| Before molding | 5.46 |
| After molding | 5.43 |

EXAMPLE 6

A liquid crystalline polyester consisting of 9.2 mole percent 1,4-cyclohexanedicarboxylic acid residues, 9.9 mole percent terephthalic acid residues, 9.9 mole percent 2,6-naphthalenedicarboxylic acid residues, 29 mole percent hydroquinone residues and 42 mole percent p-hydroxybenzoic acid residues was prepared using the procedures described in the preceding examples. A sample of this LCP was heated under nitrogen (40 mL/minute) in a Thermogravimetric Analyzer (Model 2950, TA Instruments) from 23 to 600° C. at the rate of 20° C. per minute and the weight loss of the sample was measured over the heating range. The temperature at which the sample had lost 10% of its original weight was 478° C. This example illustrates the excellent thermal stability of the LCP even though it contains 9.2 mole percent of the cycloaliphatic moiety derived from 1,4-cyclohexanedicarboxylic acid.

CONTROL EXAMPLE 2

This example illustrates the preparation of a control LCP containing 4,4'-biphenol residues and a high level of p-hydroxybenzoic acid residues but no 1,4-cyclohexanedicarboxylic acid (CHDA) residues.

A 500-mL, single-necked flask is equipped with a stainless steel stirrer and provisions for applying vacuum, maintaining a nitrogen atmosphere, and removal of volatile materials. Into the flask are placed 3.11 g (0.01875 mole) of terephthalic acid, 4.05 g (0.01875 mole) of 2,6-naphthalenedicarboxylic acid, 10.12 g (0.0375 mole) 4,4'-biphenylene diacetate, and 31.5 g (0.175 mole) of p-acetoxybenzoic acid. The flask then is evacuated and bled to nitrogen three times and then is partially immersed in a Belmont metal bath maintained at 250° C. for 15 minutes and at 280° C. for 45 minutes. Stirring is begun as soon as the flask contents have melted. The flask is then heated with stirring under a nitrogen atmosphere at 300° C. for 1 hour, 320° C. for 1 hour, and 350° C. for 5 minutes. Vacuum is then applied during 10 minutes to 0.5 torr for 30 minutes to obtain a high viscosity, tan polymer. The system then is bled to nitrogen, the flask is cooled to room temperature under a nitrogen atmosphere, and the polymer is removed from the flask. The polymer has an IV of 1.23 (partially insoluble in the IV solvent) and a melting point of 344° C.

EXAMPLE 7

This example illustrates the preparation of an LCP composition containing no terephthalic acid residues.

The general procedure described in Control Example 2 is repeated using the following charge of materials: 15.1 g (0.07 mole) of 2,6-naphthalenedicarboxylic acid, 5.2 g (0.03 mole) 1,4-cyclohexanedicarboxylic acid (CHDA), 28.89 g (0.107 mole, 7% excess) 4,4'-biphenylene diacetate, and 27.0 g (0.15 mole) p-acetoxybenzoic acid. The flask is partially immersed in a Belmont metal bath maintained at 250° C. for 20 minutes and at 280° C. for 40 minutes. The flask is then heated with stirring under a nitrogen atmosphere at 300° C. for 1 hour, 320° C. for 1 hour, and 350° C. for 10 minutes. Vacuum then is applied during 15 minutes to 0.5 torr and held for 60 minutes at 350° C. to obtain a high viscosity, tan polymer having an IV of 5.36 and a melting point of 295° C.

EXAMPLE 8

This example illustrates the preparation of an LCP composition containing moderate levels of T, N, CHDA, BP, and PHB residues.

The general procedure described in Control Example 2 is repeated using the following charge of materials: 5.00 g (0.03 mole) terephthalic acid, 7.60 g (0.035 mole) of 2,6-naphthalenedicarboxylic acid, 6.0 g (0.035 mole) 1,4-cyclohexanedicarboxylic acid (CHDA), 28.89 g (0.107 mole, 7% excess) 4,4'-biphenylene diacetate, and 27.0 g (0.15 mole) p-acetoxybenzoic acid. The flask is partially immersed in a Belmont metal bath maintained at 250° C. for 30 minutes and at 280° C. for 60 minutes. The flask is then heated with stirring under a nitrogen atmosphere at 300° C. for 1 hour, 320° C. for 1 hour, and 350° C. for 5 minutes. Vacuum is then applied during 15 minutes to 0.5 torr and held for 30 minutes at 350° C. to obtain a high viscosity, tan polymer having an IV of 6.64 and a melting point of 316° C.

EXAMPLE 9

This example illustrates the preparation of an LCP containing moderate levels of CHDA anc. N residues and moderately low levels of T and PHB residues.

The general procedure described in Control Example 2 is repeated using the following charge of materials: 4.15 g (0.025 mole) terephthalic acid, 13.50 g (0.0625 mole) of 2,6-naphthalenedicarboxylic acid, 12.0 g (0.070 mole) 1,4-cyclohexanedicarboxylic acid (CHDA), 45.50 g (0.1685 mole, 7% excess) 4,4'-biphenylene diacetate, and 16.65 g (0.0925 mole) p-acetoxybenzoic acid. The flask is partially immersed in a Belmont metal bath maintained at 250° C. for 30 minutes and at 280° C. for 60 minutes. The flask then is heated with stirring under a nitrogen atmosphere at 300° C. for 1 hour, 320° C. for 1 hour, and 350° C. for 5 minutes. Vacuum then is applied during 15 minutes to 0.5 torr and held for 30 minutes at 350° C. to obtain a moderately high viscosity, tan polymer having an IV of 4.71 and a melting point of 342° C.

The invention has been described in detail with particular reference to preferred embodiments thereof, but it will be understood that variations and modifications will be effected within the spirit and scope of the invention.

We claim:

1. A liquid crystalline polyester consisting essentially of:
   (1) diacid residues consisting of (i) 2 to 34 mole percent cyclohexanedicarboxylic acid (CHDA) residues and (ii) 5 to 48 mole percent of other diacid residues selected from terephthalic acid (T) residues, 2,6-naphthalenedicarboxylic acid (N) residues, or a mixture thereof;
   (2) diol residues consisting essentially of 15 to 50 mole percent of hydroquinone (HQ) residues, 4,4'-biphenol residues or a mixture thereof; and
   (3) 0 to 70 mole percent p-hydroxybenzoic acid (PHB) residues, wherein the moles of diol residues are equal to the moles of diacid residues, the total of the (1), (2) and (3) mole percentages is equal to 10(, and the liquid crystalline polyester has a melting point determined by differential scanning calorimetry equal to or less than 375° C.

2. A liquid crystalline polyester according to claim 1 having an inherent viscosity of about 4 to 8 dL/g measured at 25° C. in 60:40 by weight pentafluorophenol/1,2,4-trichlorobenzene at 0.1 g/100 mL in a Schott Gerate viscometer.

3. A liquid crystalline polyester consisting essentially of:
   (1) diacid residues consisting of (i) 2 to 34 mole percent cyclohexanedicarboxylic acid (CHDA) residues and (ii) 5 to 48 mole percent of other diacid residues selected from terephthalic acid (T) residues, 2,6-naphthalenedicarboxylic acid (N) residues, or a mixture thereof;
   (2) diol residues consisting essentially of 16.5 to 50 mole percent of hydroquinone (HQ) residues; and
   (3) 0 to 67 mole percent p-hydroxybenzoic acid (PHB) residues, wherein the moles of diol residues are equal to the moles of diacid residues, the total of the (1), (2) and (3) mole percentages is equal to 10(, and the liquid crystalline polyester has a melting point determined by differential scanning calorimetry (DSC) equal to or less than 375° C.

4. A liquid crystalline polyester according to claim 3 having an inherent viscosity of about 4 to 8 dL/g measured at 25° C. in 60:40 by weight pentafluorophenol/1,2,4-trichlorobenzene at 0.1 g/100 mL in a Schott Gerate viscometer.

5. A liquid crystalline polyester consisting essentially of:
   (1) diacid residues consisting of (i) 2 to 30 mole percent cyclohexanedicarboxylic acid (CHDA) residues and (ii) 5 to 40.5 mole percent of other diacid residues selected from terephthalic acid (T) residues, 2,6-naphthalenedicarboxylic acid (N) residues, or a mixture thereof;

(2) diol residues consisting essentially of 15 to 42.5 mole percent of 4,4'-biphenol (BP) residues; and (3) 15 to 70 mole percent p-hydroxbenzoic acid (PHB) residues, wherein the moles of diol residues are equal to the moles of diacid residues, the total of the (1), (2) and (3) mole percentages is equal to 100, and the liquid crystalline polyester has a melting point determined by differential scanning calorimetry (DSC) equal to or less than 375° C.

6. A liquid crystalline polyester according to claim 7 having an inherent viscosity of about 4 to 8 dL/g measured at 25° C. in 60:40 by weight pentafluorophenol/1,2,4-trichlorobenzene at 0.L g/100 mL in a Schott Gerate viscometer.

7. A liquid crystalline polyester molding composition comprising an intimate blend of:

(1) a liquid crystalline polyester defined in claim 1; and (2) at least 20 weight percent glass fibers based on the total weight of the molding composition.

8. A molding composition according to claim 7 wherein the liquid crystalline polyester has an inherent viscosity of about 4 to 8 dL/g measured at 25° C. in 60:40 by weight pentafluorophenol/1,2,4-trichlorobenzene at 0.1 g/100 mL in a Schott Gerate viscometer and the molding composition contains about 25 to 40 weight percent glass fibers based on the total weight of the molding composition.

9. A molding composition according to claim 8 wherein the glass fiber has a thickness of about 9 to 15 microns and a length of about 0.8 to 26 mm.

10. A liquid crystalline polyester molding composition according to claim 7 comprising an intimate blend of:

(1) a liquid crystalline polyester refined in claim 3; and (2) at least 20 weight percent glass fibers based on the total weight of the molding composition.

11. A molding composition according to claim 10 wherein the liquid crystalline polyester has an inherent viscosity of about 4 to 8 dL/g measured at 25° C. in 60:40 by weight pentafluorophenol/1,2,4-trichlorobenzene at 0.1 g/100 mL in a Schott Gerate viscometer and the molding composition contains about 25 to 40 weight percent glass fibers based on the total weight of the molding composition.

12. A molding composition according to claim 11 wherein the glass fiber has a thickness of about 9 to 15 microns and a length of about 0.8 to 26 mm.

13. A liquid crystalline polyester molding composition according to claim 7 comprising an intimate blend of:

(1) a liquid crystalline polyester defined in claim 5; and (2) at least 20 weight percent glass fibers based on the total weight of the molding composition.

14. A molding composition according to claim 13 wherein the liquid crystalline polyester has an inherent viscosity of about 4 to 8 dL/g measured at 25° C. in 60:40 by weight pentafluorophenol/1,2,4-trichlorobenzene at 0.1 g/100 mL in a Schott Gerate viscometer and the molding composition contains about 25 to 40 weight percent glass fibers based on the total weight of the molding composition.

15. A molding composition according to claim 14 wherein the glass fiber has a thickness of about 9 to 15 microns and a length of about 0.8 to 26 mm.

16. A molded article having a thickness of less than about 1.5 mm comprised of a composition defined in claim 7.

17. A molded article having a thickness of less than about 1.5 mm comprised of a composition defined in claim 10.

18. A molded article having a thickness of less than about 1.5 mm comprised of a composition defined in claim 13.

* * * * *

UNITED STATES PATENT AND TRADEMARK OFFICE
CERTIFICATE OF CORRECTION

PATENT NO. : 6,093,787
DATED : July 25, 2000
INVENTOR(S) : Long et al.

It is certified that error appears in the above-identified patent and that said Letters Patent is hereby corrected as shown below:

Column 10,
Line 32, please delete "10(," and insert "100," therefore.
Line 53, please delete "10(," and insert "100," therefore.

Signed and Sealed this

Twenty-fifth Day of September, 2001

Attest:

Attesting Officer

NICHOLAS P. GODICI
Acting Director of the United States Patent and Trademark Office